US008854135B2

(12) United States Patent
Cuenca et al.

(10) Patent No.: US 8,854,135 B2
(45) Date of Patent: Oct. 7, 2014

(54) OPERATIONAL AMPLIFIER WITH ELIMINATION OF OFFSET VOLTAGE

(71) Applicant: STMicroelectronics (Rousset) SAS, Rousset (FR)

(72) Inventors: Michel Cuenca, Septemes les Vallons (FR); Laurent Truphemus, Pourrieres (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 76 days.

(21) Appl. No.: 13/752,538

(22) Filed: Jan. 29, 2013

(65) Prior Publication Data

US 2013/0207720 A1 Aug. 15, 2013

(30) Foreign Application Priority Data

Jan. 30, 2012 (FR) ...................... 12 50845

(51) Int. Cl.
*H03F 3/45* (2006.01)
*H03F 1/08* (2006.01)

(52) U.S. Cl.
CPC ........ *H03F 3/45076* (2013.01); *H03F 3/45192* (2013.01); *H03F 1/086* (2013.01); *H03F 2203/45471* (2013.01); *H03F 2203/45322* (2013.01); *H03F 2200/36* (2013.01); *H03F 3/45771* (2013.01); *H03F 2203/45392* (2013.01); *H03F 2203/45391* (2013.01); *H03F 2200/447* (2013.01)
USPC .......................................... 330/256; 330/261

(58) Field of Classification Search
USPC .......................................... 330/256, 261, 289
See application file for complete search history.

(56) References Cited

U.S. PATENT DOCUMENTS

| 3,443,235 | A |   | 5/1969 | Newbold |
|---|---|---|---|---|
| 5,331,478 | A | * | 7/1994 | Aranovsky ...................... 360/67 |
| 5,614,860 | A | * | 3/1997 | Osaki et al. ..................... 327/552 |
| 5,708,391 | A | * | 1/1998 | Altmann et al. ............... 330/252 |
| 6,229,395 | B1 | * | 5/2001 | Kay ............................... 330/252 |
| 2008/0030271 | A1 | * | 2/2008 | Aoyama et al. ............... 330/252 |
| 2008/0061745 | A1 |   | 3/2008 | Nodo |
| 2008/0074187 | A1 | * | 3/2008 | Chen et al. ..................... 330/252 |
| 2011/0057718 | A1 |   | 3/2011 | Snoeij et al. |

* cited by examiner

*Primary Examiner* — Henry Choe
(74) *Attorney, Agent, or Firm* — Allen, Dyer, Doppelt, Milbrath & Gilchrist, P.A.

(57) ABSTRACT

An operational amplifier may include a differential stage comprising two transistors whose gates are respectively linked to the two inputs of the operational amplifier. The sources of the two transistors may be linked to a first current source whose delivered current depends negatively on temperature variations and to a second current source whose delivered current is proportional to absolute temperature. The sum of these two currents may be less dependent on temperature, in that this link of the sources of the two transistors with the two current sources is effected respectively by way of two resistors, and in that the current which passes through the two transistors is imposed of proportional with temperature type, so as to allow substantially temperature-independent elimination of the offset voltage of the operational amplifier while obtaining a temperature-independent constant gain-bandwidth product.

20 Claims, 7 Drawing Sheets

OPERATIONAL AMPLIFIER WITH ELIMINATION OF OFFSET VOLTAGE

FIELD OF THE DISCLOSURE

The present disclosure relates to an amplifier for integrated circuits and to a method for stabilizing an operational amplifier.

BACKGROUND

An operational amplifier is an analog circuit that amplifies voltages with a high gain. It produces as an output, a voltage proportional to a voltage difference on two inputs, i.e. the inverting and non-inverting inputs. Operational amplifiers are generally manufactured in integrated circuit form. In a typical layout, several separate operational amplifiers may be integrated on one and the same substrate with numerous other circuit elements, both analog and digital.

A simplified diagram of an exemplary operational amplifier 1 of the CMOS type is represented in FIG. 1. It therefore comprises two inputs 2, 3 to which are respectively applied voltages Vp, Vm, and an output 4 at the amplified potential Vout. The example is based upon an architecture with three stages comprising a differential input stage 6, in general comprising NMOS or PMOS transistors or a combination of the two, a drive stage 7, and a power stage 8. The latter constitutes also the output stage of the operational amplifier. FIG. 2 illustrates in greater detail the internal electrical circuit of an operational amplifier comprising two stages. The first differential input stage 6 comprises a pair of transistors M1, M2 and a current source Ib.

An operational amplifier 1 amplifies the voltage difference between its inputs 2, 3, and the output voltage Vout is in theory in the middle of the output dynamic range when these inputs are at the same potential (that is to say when Vp=Vm, for example, by being linked directly to one another). However, as is known, in practice an operational amplifier exhibits a spurious output voltage, called the offset voltage or more simply the "offset." This offset voltage, which varies with temperature, results from an imbalance between the characteristics of the inputs of the amplifier and adds an inaccuracy in the operation of the operational amplifier with respect to its theoretical characteristics.

To alleviate this drawback, FIG. 3 shows an exemplary operational amplifier comprising architecture similar to that of FIG. 1, and a device 9 for eliminating the offset voltage, allowing the zeroing of the offset voltage Voffset. FIG. 4 represents in greater detail the electrical circuit of the device 9 for eliminating the offset voltage according to the prior art, disposed at the level of the differential input stage 6. It is based upon a current source 10, the current provided Ib being independent of temperature variations, known by the simplified term of ZTAT (Zero to Absolute Temperature). This circuit comprises n equivalent first resistors Rp (R1$p$ to Rn$p$) arranged in series from the source of the first transistor M1 attached to the first input 2 of the operational amplifier, and separated by various intermediate contacts T1$p$ to Tn$p$ on which a resistor switching contact is possible. In a similar manner, n equivalent second resistors Rm (R1$m$ to Rn$m$) are arranged in series with the previous resistors (R1$p$ to Rn$p$) up to the source of the second transistor M2 attached to the second input 3 of the operational amplifier. These n second resistors are separated by various intermediate contacts T1$m$ to Tn$m$ on which a resistor switching contact is possible. A contact T0 is arranged between these two sets of resistors Rp and Rm. The various contacts Ti$p$ and Tj$m$ may be linked to the current source 10 by way of a switchable contact 11. The positioning of this contact makes it possible to ultimately define the resulting overall resistors R1, R2 arranged on either side of this contact 11 and therefore of the current source 10.

FIG. 4 illustrates the particular case where the switchable contact 11 is positioned on the central contact T0. The various voltages represented in FIG. 4 are governed by the following relation:

$$Vs = Vp - Vgsm1 - n*Rp*Ib/2 = Vm - Vgsm2 - n*Rm*Ib/2.$$

By calling VRp=n*Rp*Ib/2 and VRm=n*Rm*Ib/2, the above equation becomes:

$$Vs = Vp - Vgsm1 - VRp = Vm - Vgsm2 - VRm.$$

By taking account of the offset voltage Voffset, the voltage Vp becomes Vp−Voffset and the above equation ultimately gives:

$$Vp - Voffset - Vgsm1 - VRp = Vm - Vgsm2 - VRm. \quad (1)$$

By modifying the positioning of the switchable contact 11 of the circuit of FIG. 4, for example, by displacing it by k contacts to the left in the case where the offset voltage is positive, the above equation becomes:

$$Vp - Voffset - Vgsm1 - (VRp - kRpIb/2) = Vm - Vgsm2 - (VRm + kRp*Ib/2).$$

This equation can also be written:

$$Vp - (Voffset - 2*kRpIb/2) - Vgsm1 - VRp = Vm - Vgsm2 - VRm \quad (2)$$

By comparing this equation (2) with equation (1), it is therefore realized that the switching of the switchable contact 11 has an effect equivalent to a reduction in the offset voltage by a value 2*k Rp Ib/2. Thus, it is possible to choose k in such a way as to obtain the lowest possible value of the offset voltage and this approach makes it possible to eliminate or reduce this offset voltage.

Naturally, the same principle is applied if the offset voltage is negative, in which case the contact 11 is switched to the right, and makes it possible to increase this offset voltage by a value of 2*k Rm Ib/2. This discrete value, used to eliminate the offset voltage, will be chosen as low as possible. With the use of the current source of ZTAT type to induce the current Ib, the variation of this quantity with temperature is minimized.

Though this approach may be effective in reducing the offset voltage of an operational amplifier in a temperature-independent manner, it may exhibit the drawback, however, of greatly reducing its performance at the level of its gain-bandwidth product. Indeed, as is apparent in FIG. 5, which represents the curve 15 of the gain-bandwidth product of the amplifier with temperature, this gain-bandwidth product drops by 40% over a temperature span from −40 to 125° C. It is noted that the gain-bandwidth product of an operational amplifier implementing the approach described hereinabove operates in a manner substantially proportional to the inverse of the absolute temperature (1/T).

SUMMARY

Thus, an object is to seek an approach that makes it possible to eliminate or reduce the offset voltage of an operational amplifier while obtaining a satisfactory gain-bandwidth product, whatever the temperature.

For this purpose, an operational amplifier may comprise a differential stage comprising at least two transistors whose gates are respectively linked to the two inputs of the operational amplifier, and comprising a device for eliminating the offset voltage. The sources of the at least two transistors may be linked to a first current source whose delivered current Ict depends negatively on temperature variations (CTAT) and to a second current source whose delivered current Ipt is proportional to absolute temperature (PTAT), so that the sum of these two currents (Ict+Ipt) is less dependent on temperature. This link of the sources of the at least two transistors with the two current sources may be effected respectively by way of two resistors, and in that the current which passes through the two transistors is imposed of proportional with temperature type (PTAT), so as to allow substantially temperature-independent elimination of the offset voltage of the operational amplifier while obtaining a temperature-independent constant gain-bandwidth product.

The operational amplifier may comprise two additional current sources of type varying negatively with temperature (CTAT) respectively connected to the sources of the two transistors and whose current is imposed at a value equal to half the current of the first current source. The operational amplifier can comprise a first resistor arranged between the source of the first transistor and a contact with the two first and second current sources, and a second resistor arranged between the source of the second transistor and the contact towards the two first and second current sources.

The first and second current sources may be arranged on respectively two parallel branches onwards of the contact arranged between the two resistors. The two resistors may comprise several resistors (Rip, Rjm, where i and j vary from 1 to n) arranged in series and separated by contacts (Tip, Tjm, where i and j vary from 1 to n) able to be connected to a switchable contact to which the two current sources are attached.

The operational amplifier may comprise a first differential input stage comprising the offset voltage elimination device. It can comprise at least one other power stage or at least two additional drive and power stages.

Another aspect is directed to a method for stabilizing the operation of an operational amplifier. The method may comprise generating a first current Ict dependent negatively on temperature variations (CTAT) and a second current Ipt proportional to absolute temperature (PTAT) so that the sum of these two currents (Ict+Ipt) is less dependent on temperature. This may allow substantially temperature-independent elimination of the offset voltage of the operational amplifier while obtaining a temperature-independent constant gain-bandwidth product.

The method for stabilizing the operation of an operational amplifier may comprise the circulation of a current (Ipt/2) at the level of two transistors of a differential stage of the operational amplifier whose gates are respectively attached to the two inputs of the operational amplifier, and the circulation of a current of value (Ipt+Ict)/2 at the level of resistors respectively lying between the sources of the two transistors and an intermediate contact attached to two current sources implementing the generation of the two currents (Ipt, Ict). The method may comprise the displacement of k contacts to the left of the switchable intermediate contact with respect to a central position between the resistors so as to obtain an effect equivalent to a reduction in the offset voltage by a value 2*k Rp (Ict+Ipt)/2 or of k contacts to the right of the contact so as to obtain an effect equivalent to a reduction in the offset voltage by a value 2*k Rm (Ict+Ipt)/2, Rp and Rm representing respectively left and right resistors separated by switchable contacts.

BRIEF DESCRIPTION OF THE DRAWINGS

These objects, characteristics and advantages of the present embodiments will be set forth in detail in the following description of a particular embodiment offered without limitation in conjunction with the appended figures among which.

DETAILED DESCRIPTION

Figure 1:
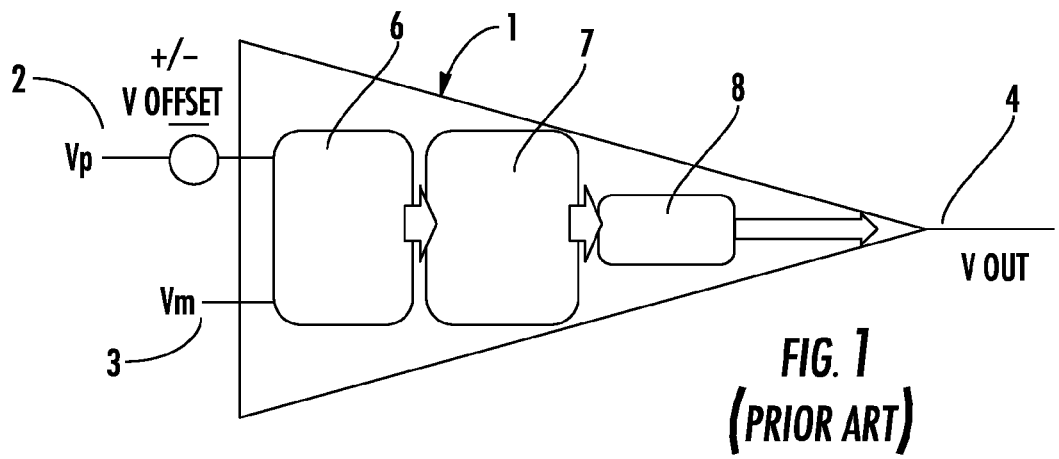
FIG. 1 is a schematic diagram of an operational amplifier, according to the prior art.
Figure 2:
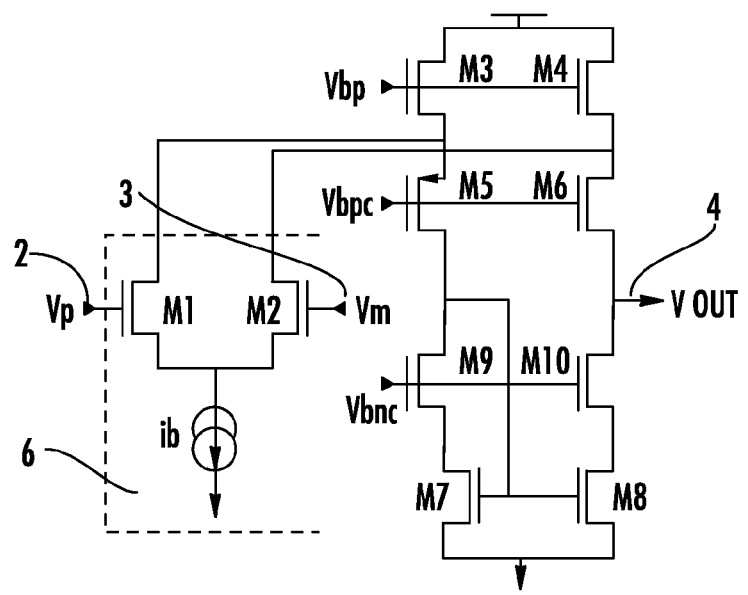
FIG. 2 is a schematic diagram of the electrical circuit of an operational amplifier, according to the prior art.
Figure 3:
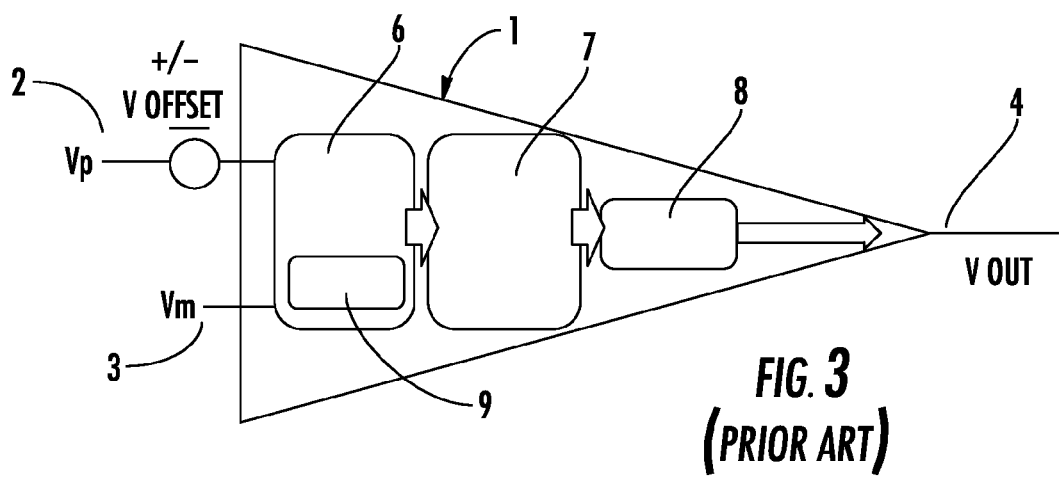
FIG. 3 is a schematic diagram of a second operational amplifier, according to the prior art.
Figure 4:
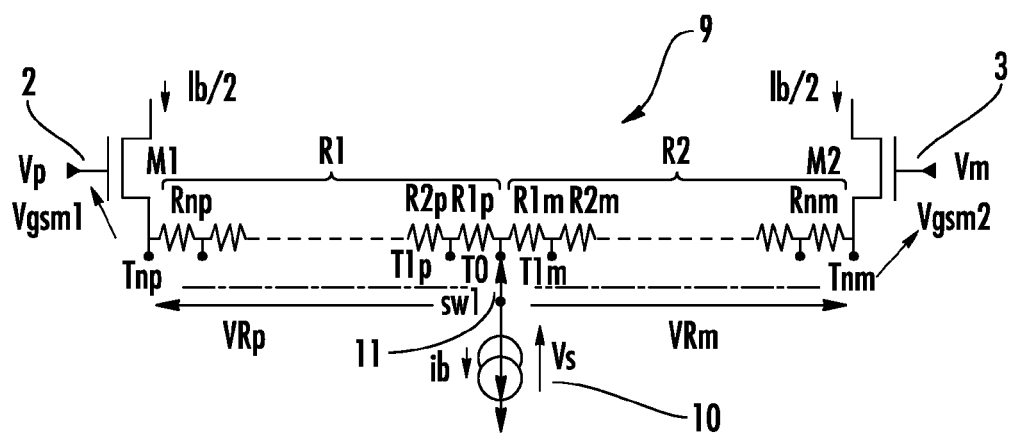
FIG. 4 is a schematic diagram of the electrical circuit of a device for eliminating the offset voltage of the operational amplifier of FIG. 3.
Figure 5:
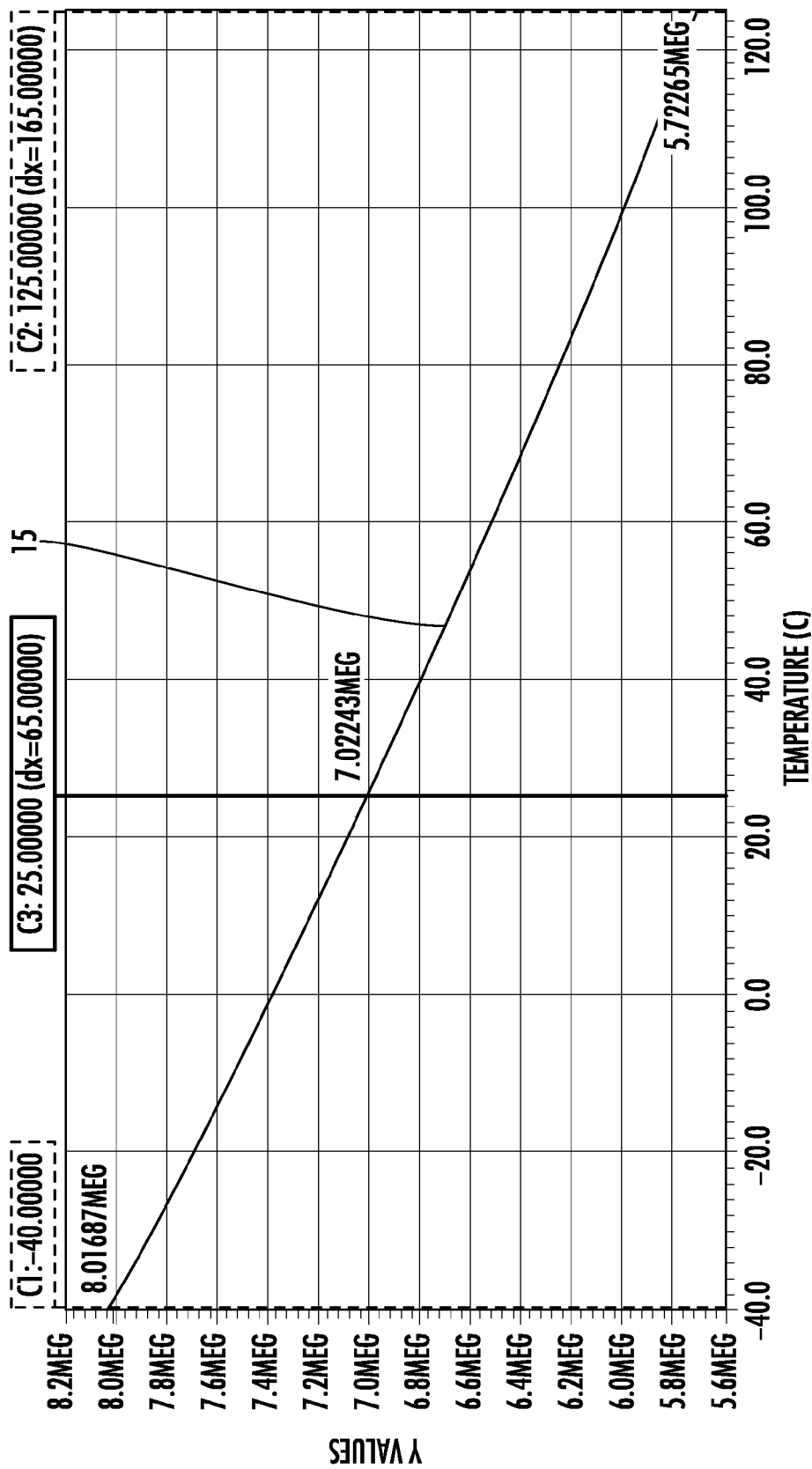
FIG. 5 is a chart of the gain-bandwidth product of the operational amplifier of FIG. 3 as a function of temperature.

In the approach represented by FIG. 4, the transconductance gm of the differential stage is equal to K Ib/T, where K is a constant, and T is the temperature. As the current Ib has been chosen with a low dependency in relation to temperature, the transconductance thus becomes variable in a manner proportional with the inverse of the temperature. This dependency greatly affects the gain-bandwidth product of the operational amplifier, which becomes likewise variable in a manner proportional with the inverse of the temperature. This analysis explains the behavior noted in FIG. 5.

Figure 6:
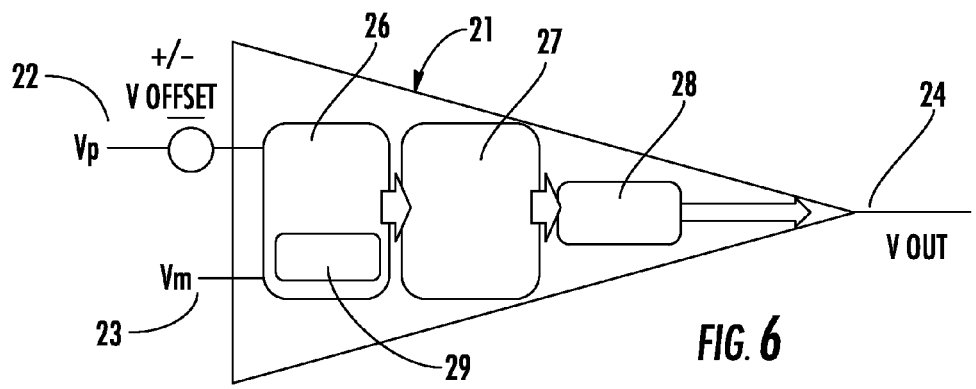
FIG. 6 is a schematic diagram of an operational amplifier, according to an embodiment of the present disclosure.
Figure 7:
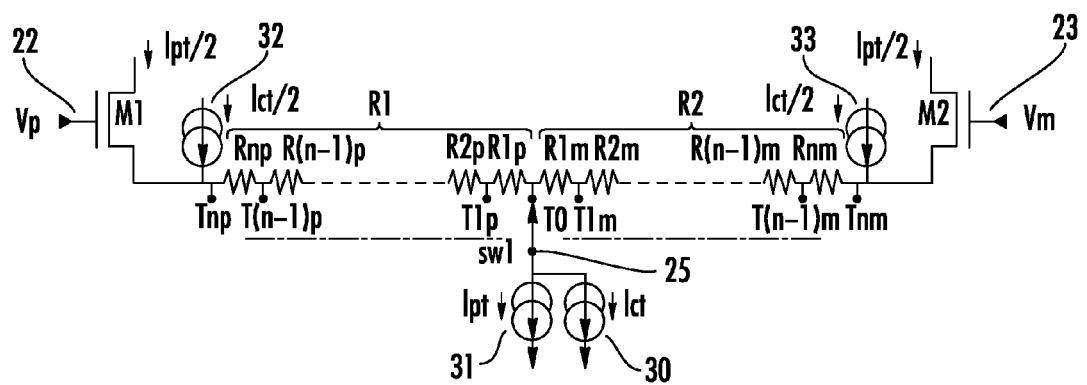
FIG. 7 is a schematic diagram of the electrical circuit of the device for eliminating the offset voltage of the operational amplifier, according to the embodiment of the present disclosure.

An embodiment of an operational amplifier 21 is presented in FIGS. 6 and 7. This operational amplifier 21 is obtained by the technique of complementary metal-oxide-semiconductor (CMOS) and comprises two inputs 22, 23 to which are applied voltages Vp, Vm and an output 24 at the amplified potential Vout. The example is based on an architecture of three stages comprising a differential input stage 26, a drive stage 27, and a power stage 28. The differential input stage 26 integrates a device 29 for eliminating the offset voltage, allowing the zeroing of the offset voltage Voffset.

FIG. 7 represents in greater detail the electrical circuit of the device 29 for eliminating the offset voltage according to the embodiment. It rests upon a separation of the current Ib passing through the two transistors M1, M2, of the differential stage, whose gates are respectively attached to the two inputs 22, 23 of the operational amplifier. It in fact comprises two current sources 30, 31 instead of just one in the prior art approach represented by FIG. 4. The first current source 30 depends negatively on temperature variations, is of the type known by Complementary To Absolute Temperature (CTAT) and delivers a current Ict, and the second current source 31 delivers a current Ipt proportional to absolute temperature Proportional To Absolute Temperature (PTAT). The sum of these two currents Ict and Ipt is thus of ZTAT type, therefore independent of temperature, or indeed hardly dependent on temperature. Thus, the association in parallel of the two current sources 30, 31 forms a resulting current source of ZTAT type. These two current sources 30, 31 are arranged on two parallel branches onwards of a contact 25, linking them to resistors R1, R2 which will be detailed hereinafter.

In addition to this generation of currents Ict, Ipt of two different kinds, this circuit comprises moreover n equivalent first resistors Rp (R1p to Rnp) and n resistors Rm (R1m to Rnm) in series arranged between the sources of the two transistors M1, M2 respectively attached to the first input 22 and to the second input 23 of the operational amplifier. These resistors are separated by various intermediate contacts T1p to Tnp, T1m to Tnm on which a contact 25 with the two current sources 30, 31 is possible. Thus, the various contacts Tip and Tjm may be linked to the current sources 30, 31 by way of this switchable contact 25, whose position makes it possible to ultimately define the resulting overall resistors R1, R2 arranged on either side of this contact 25.

Figure 8:
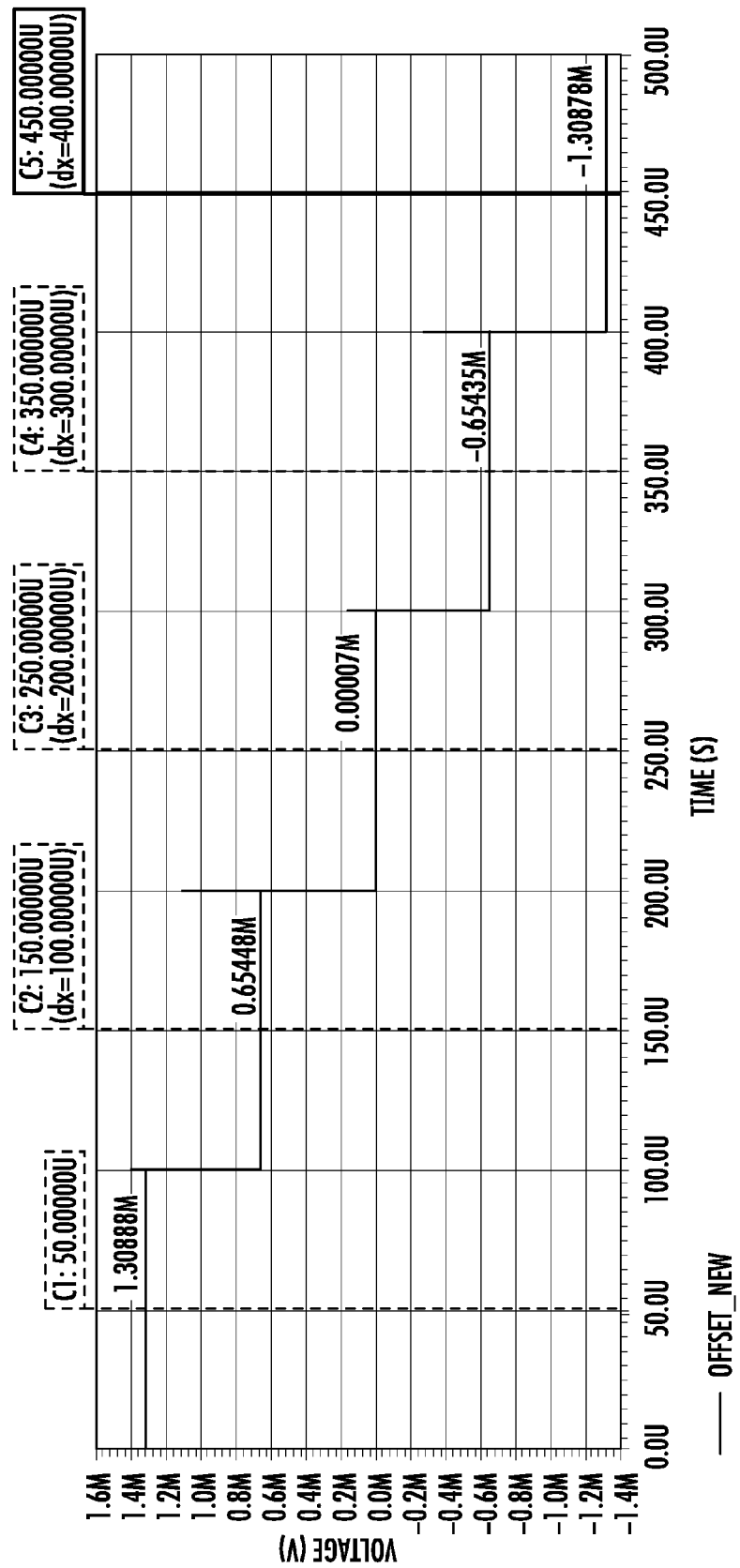
FIG. 8 is a chart of the offset voltage of this operational amplifier as a function of the position of the switchable contact, according to the embodiment of the present disclosure.
Figure 9:
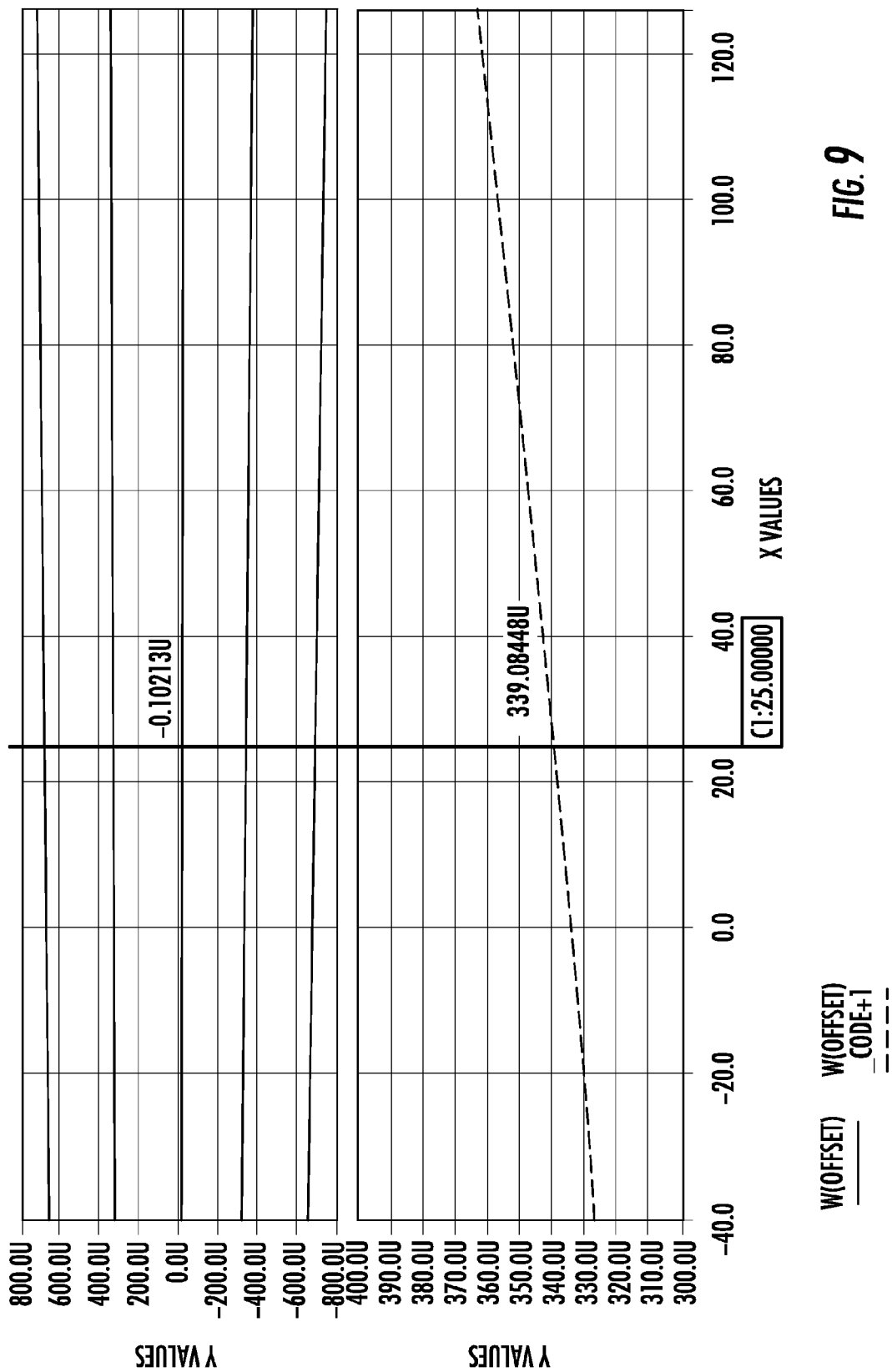
FIG. 9 is another chart of the offset voltage of this operational amplifier as a function of the temperature for various positions of the switchable contact, according to the embodiment of the present disclosure.

The above circuit makes it possible to modify an offset voltage in a manner similar to the approach described previously with reference to FIG. 4. Thus, FIG. 8 illustrates by way of example the offset voltage as a function of the position of the switchable contact 25, and FIG. 9 represents the offset voltage as a function of temperature for several positions of the switchable contact 25. It is indeed apparent that this positioning makes it possible to modify this offset voltage and that there exists a positioning making it possible to minimize it. Moreover, it is also apparent that this offset voltage does not depend on temperature.

Figure 10:
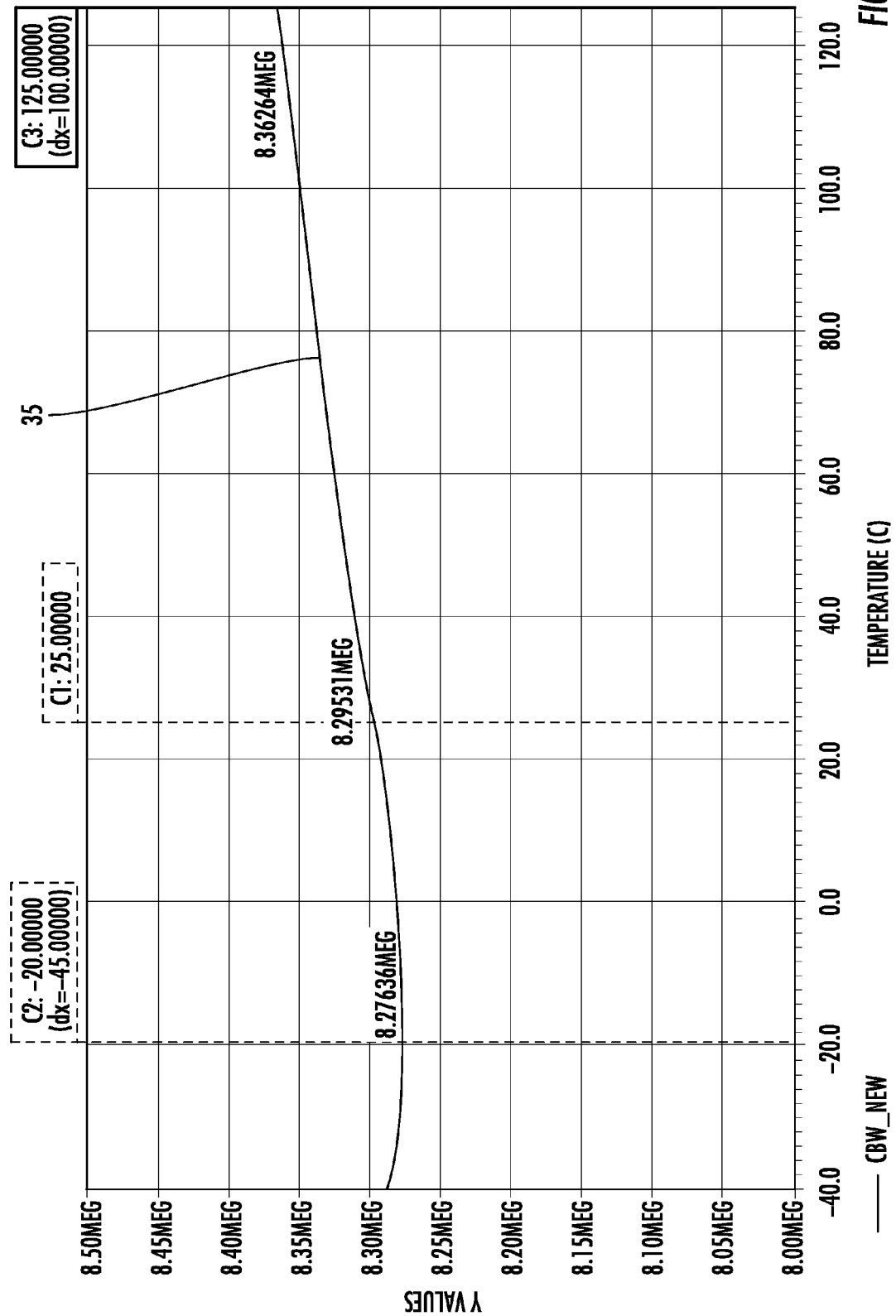
FIG. 10 is another chart of the gain-bandwidth product of this operational amplifier, according to the present disclosure, as a function of temperature.

With the configuration represented in FIG. 7, the current passing through each chain of resistors Rp and Rm is equal to (Ipt+Ict)/2. Moreover, the current which circulates at the level of the transistors M1, M2 forming the differential stage function is equal to Ipt/2. This current is obtained by way of two additional current sources 32, 33, i.e. a third and a fourth current source, respectively connected to the sources of the transistors M1, M2 and linked to the ends of the resistors R1, R2, in which the current Ict/2, of CTAT type, is imposed. The current Ipt, which passes through the transistors M1, M2, being proportional to temperature, the transconductance of this differential stage becomes independent of temperature, constant despite the temperature variation. It follows from this that the gain-bandwidth product of the operational amplifier becomes likewise independent of temperature. Thus, the operational amplifier according to the embodiment exhibits the advantage of eliminating the offset voltage for any temperature, and a significant and constant gain-bandwidth product for any temperature. FIG. 10 thus represents the curve 35 of the gain-bandwidth product as a function of temperature. It is apparent that this gain may be considered to be constant, since it is restricted within an amplitude variation span of about 1%.

Naturally, the embodiment represented by way of example can exhibit variants. For example, the transistors M1, M2 may be of PMOS or NMOS type, or a combination of the two types. The switchable resistor exhibits the advantage of allowing an adjustment, a tailoring of the approach. As a variant, the two resistors R1, R2 could be predefined, once and for all, as non-modifiable. Their various resistors Rip, Rjm may be identical or different, and there may be any number of resistors. Moreover, the sum of the two current sources 30, 31 is of ZTAT type, independent of temperature; as a variant, this association of several current sources may be of various types, as long as it is hardly dependent on temperature, that is to say varies in a restricted span. Thereafter, the above-described device for eliminating the offset voltage may be implemented on any operational amplifier.

That which is claimed is:

1. An amplifier comprising:
   first and second inputs;
   first and second current sources; and
   a differential stage comprising first and second transistors having gate terminals respectively coupled to said first and second inputs, and source terminals respectively coupled to said first and second current sources;
   said first current source configured to generate a first current negatively dependent on temperature;
   said second current source configured to generate a second current being proportional to the temperature, thereby obtaining a temperature-independent constant gain-bandwidth product.

2. The amplifier according to claim 1 further comprising third and fourth current sources being respectively coupled to said source terminals of said first and second transistors, said third and fourth current sources configured to generate a current equal to half the first current and being negatively dependent on the temperature.

3. The amplifier according to claim 1 further comprising:
   a contact terminal being common with said first and second current sources;
   a first resistor between said source terminal of said first transistor and said contact terminal; and
   a second resistor between said source terminal of said second transistor and said contact terminal.

4. The amplifier according to claim 3 wherein said first and second current sources are coupled in parallel with respect to said contact terminal and between said first and second resistors.

5. The amplifier according to claim 3 wherein said first resistor comprises a first plurality of resistors coupled in series, and a first plurality of switchable contacts between adjacent ones of said first resistors; wherein said second resistor comprises a second plurality of resistors coupled in series, and a second plurality of switchable contacts between adjacent ones of said second resistors; and wherein said contact terminal is configured to switchingly couple to respective ones of said first and second pluralities of contacts.

6. The amplifier according to claim 1 further comprising a drive stage downstream from said differential stage, and a power stage downstream from said drive stage.

7. An amplifier comprising:
   first and second inputs;
   first and second current sources; and
   first and second transistors having gate terminals respectively coupled to said first and second inputs, and source terminals respectively coupled to said first and second current sources;
   said first current source configured to generate a first current negatively dependent on temperature, and said second current source configured to generate a second current being proportional to the temperature.

8. The amplifier according to claim 7 further comprising third and fourth current sources being respectively coupled to said source terminals of said first and second transistors, said third and fourth current sources configured to generate a current equal to half the first current and being negatively dependent on the temperature.

9. The amplifier according to claim 7 further comprising:
   a contact terminal being common with said first and second current sources;
   a first resistor between said source terminal of said first transistor and said contact terminal; and a second resistor between said source terminal of said second transistor and said contact terminal.

10. The amplifier according to claim 9 wherein said first and second current sources are coupled in parallel with respect to said contact terminal and between said first and second resistors.

11. The amplifier according to claim 9 wherein said first resistor comprises a first plurality of resistors coupled in series, and a first plurality of switchable contacts between adjacent ones of said first resistors; wherein said second resistor comprises a second plurality of resistors coupled in series, and a second plurality of switchable contacts between adjacent ones of said second resistors; and wherein said contact terminal is configured to switchingly couple to respective ones of said first and second pluralities of contacts.

12. A method for stabilizing an amplifier comprising:
using a first current source to generate a first current negatively dependent on temperature, and using a second current source to generate a second current proportional to the temperature so that a sum of the first and second currents is less dependent on the temperature to allow substantially temperature-independent reduction of an offset voltage of the amplifier while obtaining a temperature-independent constant gain-bandwidth product.

13. The method according to claim 12 further comprising:
passing a current equal to half the second current through first and second transistors of a differential stage of the amplifier, the first and second transistors having gate terminals respectively coupled to first and second inputs of the amplifier; and
passing a current equal to half the sum of the first and second currents through first and second resistors respectively coupled between source terminals of the first and second transistors and a switchable contact terminal coupled to the first and second current sources.

14. The method according to claim 13 further comprising displacing k contacts in a first direction from the switchable contact terminal with respect to a central position between the first and second resistors so as to obtain a reduction in the offset voltage by a value $2*k\ R_p(I_{ct}+I_{pt})/2$; and wherein $R_p$ and $R_m$ represent respectively the first and second resistors separated by switchable contacts, and $I_{ct}$ and $I_{pt}$ represent respectively the first and second currents.

15. The method according to claim 13 further comprising displacing k contacts in a second direction from the switchable contact terminal so as to obtain a reduction in the offset voltage by a value $2*k\ R_m(I_{ct}+I_{pt})/2$; and wherein $R_p$ and $R_m$ represent respectively the first and second resistors separated by switchable contacts, and $I_{ct}$ and $I_{pt}$ represent respectively the first and second currents.

16. A method for making an amplifier comprising:
coupling first and second transistors having gate terminals respectively coupled to first and second inputs of the amplifier, and source terminals respectively coupled to first and second current sources, the first current source generating a first current negatively dependent on temperature, and the second current source generating a second current being proportional to the temperature, thereby obtaining a temperature-independent constant gain-bandwidth product.

17. The method according to claim 16 further comprising coupling third and fourth current sources respectively to the source terminals of the first and second transistors, the third and fourth current sources generating a current equal to half the first current and being negatively dependent on the temperature.

18. The method according to claim 16 further comprising:
coupling a contact terminal common with the first and second current sources;
coupling a first resistor between the source terminal of the first transistor and the contact terminal; and
coupling a second resistor between the source terminal of the second transistor and the contact terminal.

19. The method according to claim 18 further comprising coupling the first and second current sources in parallel with respect to the contact terminal and between the first and second resistors.

20. The method according to claim 18 wherein the first resistor comprises a first plurality of resistors coupled in series, and a first plurality of switchable contacts between adjacent ones of the first resistors; wherein the second resistor comprises a second plurality of resistors coupled in series, and a second plurality of switchable contacts between adjacent ones of the second resistors; and wherein the contact terminal switchingly couples to respective ones of the first and second pluralities of contacts.

* * * * *